United States Patent
Kloess et al.

(10) Patent No.: US 10,173,613 B2
(45) Date of Patent: Jan. 8, 2019

(54) SYSTEM AND METHOD FOR MONITORING A STATE OF CHARGE OF A BATTERY

(71) Applicant: GM GLOBAL TECHNOLOGY OPERATIONS LLC, Detroit, MI (US)

(72) Inventors: Scott R. Kloess, Rochester Hills, MI (US); John T. Zuzelski, Clarkston, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 182 days.

(21) Appl. No.: 14/829,313

(22) Filed: Aug. 18, 2015

(65) Prior Publication Data
US 2017/0050592 A1     Feb. 23, 2017

(51) Int. Cl.
*G01R 31/30* (2006.01)
*B60R 16/033* (2006.01)
(Continued)

(52) U.S. Cl.
CPC .......... *B60R 16/033* (2013.01); *B62D 5/0481* (2013.01); *G01R 31/362* (2013.01); *G01R 31/3648* (2013.01); *H02J 7/00* (2013.01)

(58) Field of Classification Search
CPC ................................. B60Q 9/00; G01R 31/30
(Continued)

(56) References Cited

U.S. PATENT DOCUMENTS 5,923,096 A * 7/1999 Manak ................. B60L 11/1805
                                                              307/10.1
7,336,002 B2 * 2/2008 Kato ................... F02N 11/0866
                                                              307/10.6

(Continued)

FOREIGN PATENT DOCUMENTS

| CN | 103963783 A | * | 8/2014 | ............. G05D 1/021 |
|---|---|---|---|---|
| CN | 104044629 A | * | 9/2014 | ............ B60W 10/20 |

(Continued)

OTHER PUBLICATIONS

Analysis of dynamic voltage drop with PVT variation in FinFET designs; Yongchan Ban; Changseok Choi; Hosoon Shin; Jaewook Lee; Yongseok Kang; Woohyun Paik; 2014 International SoC Design Conference (ISOCC); Year: 2014; pp. 132-133, DOI: 10.1109/ISOCC.2014.7087608.*
Modelling and Analysis of Electric Vehicle DC Fast Charging Infrastructure Based on PSIM; Agus Purwadi; Nadhilah Shani; Nana Heryana; Tri Hardimasyar; M. Firmansyah; Arrester Sr 2013 1st International Conference on Artificial Intelligence, Modelling and Simulation; Year: 2013; pp. 359-364, DOI: 10.1109/AIMS.2013.66.*

(Continued)

*Primary Examiner* — Cuong H Nguyen
(74) *Attorney, Agent, or Firm* — Lorenz & Kopf, LLP

(57) ABSTRACT

Systems and methods for monitoring the state of charge of a battery of a vehicle are provided. A battery monitor having a processor and a memory is configured to monitor an operating voltage and a loaded voltage of the battery. An electric power steering system is configured to be supplied with power from the battery. The battery monitor is configured to calculate a voltage drop between the operating voltage and the loaded voltage when the battery is under load from the electric power steering system. The battery monitor compares the voltage drop to a predetermined voltage drop and determines that the state of charge of the battery is low when the voltage drop is greater than or equal to the predetermined voltage drop. The battery monitor instructs the electric power steering system to operate in a limited state when the state of charge of the battery is low.

20 Claims, 3 Drawing Sheets

(51) Int. Cl.
*G01R 31/36* (2006.01)
*H02J 7/00* (2006.01)
*B62D 5/04* (2006.01)

(58) Field of Classification Search
USPC ..... 701/22, 41; 323/284–285; 320/104, 134; 180/443, 65.1; 307/10.1
See application file for complete search history.

(56) References Cited

U.S. PATENT DOCUMENTS

| | | | | |
|---|---|---|---|---|
| 7,696,719 | B2* | 4/2010 | Yamaguchi | B60W 10/06 104/34 |
| 7,839,116 | B2* | 11/2010 | Esaka | B60K 6/28 123/179.3 |
| 7,923,858 | B2* | 4/2011 | Ito | H02M 3/1582 307/9.1 |
| 8,564,241 | B2* | 10/2013 | Masuda | H02J 7/1453 320/104 |
| 8,575,897 | B2* | 11/2013 | Masuda | H02J 7/1453 320/104 |
| 8,886,412 | B2* | 11/2014 | Rosol | B60W 10/20 180/402 |
| 9,776,657 | B1* | 10/2017 | Badiru | B62D 5/0481 |
| 2006/0169526 | A1* | 8/2006 | Honbo | B62D 5/0403 180/444 |
| 2007/0213921 | A1* | 9/2007 | Yamaguchi | B60W 10/06 701/115 |
| 2008/0177444 | A1* | 7/2008 | Tachibana | B62D 5/0457 701/41 |
| 2009/0261796 | A1* | 10/2009 | Ito | H02M 3/1582 323/285 |
| 2009/0284360 | A1* | 11/2009 | Litkouhi | B60Q 9/00 340/439 |
| 2009/0322340 | A1 | 12/2009 | Zhang et al. | |
| 2010/0085019 | A1* | 4/2010 | Masuda | H02J 7/1453 320/152 |
| 2010/0286857 | A1* | 11/2010 | Otake | B60L 7/10 701/22 |
| 2011/0010052 | A1* | 1/2011 | Limpibunterng | B62D 5/046 701/41 |
| 2012/0200263 | A1* | 8/2012 | Masuda | H02J 7/1453 320/130 |
| 2014/0214256 | A1* | 7/2014 | Rosol | G05D 1/021 701/23 |
| 2014/0277893 | A1* | 9/2014 | Rosol | B60W 10/20 701/23 |
| 2015/0224845 | A1* | 8/2015 | Anderson | B60G 17/019 701/37 |

FOREIGN PATENT DOCUMENTS

| | | | | |
|---|---|---|---|---|
| CN | 106468764 | A * | 3/2017 | B60R 16/033 |
| DE | 102014100631 | A1 * | 7/2014 | G05D 1/021 |
| DE | 102014102767 | A1 * | 9/2014 | B60W 10/20 |
| DE | 102016114764 | A1 * | 2/2017 | B60R 16/033 |

OTHER PUBLICATIONS

Voltage and current signals de-noising with wavelet transform matrix for improved SOC estimation of lithium-ion battery Xiang Cheng; Zhou-Yu Lu; Zhiliang Zhang; Dong-Jie Gu; Yang Yang; 2016 IEEE Energy Conversion Congress and Exposition (ECCE); pp. 1-7; Year 2016.*
A compact unified methodology via a recurrent neural network for accurate modeling of lithium-ion battery voltage and state-of-charge; Ruxiu Zhao; Phillip J. Kollmeyer; Robert D. Lorenz; Thomas M. Jahns ; 2017 IEEE Energy Conversion Congress and Exposition (ECCE); pp. 5234-5241; year 2017.*
Practical Online Estimation of Lithium-Ion Battery Apparent Series Resistance for Mild Hybrid Vehicles; Aurélien Lievre; Ali Sari; Pascal Venet; Alaa Hijazi; Mathilde Ouattara-Brigaudet; Serge Pelissier; IEEE Transactions on Vehicular Technology Year: 2016, vol. 65, Issue: 6; pp. 4505-4511.*
Simplified Chip Power Modeling Methodology Without Netlist Information in Early Stage of SoC Design Process Baekseok Ko; Joowon Kim; Jaemin Ryoo; Chulsoon Hwang; Junyoung Song; Soo-Won Kim IEEE Transactions on Components, Packaging and Manufacturing Technology Year: 2016, vol. 6, Issue: 10; pp. 1513-1520.*
SOC estimation of lithium-ion battery based on new adaptive fading extended Kalman filter; Yaning Yang; Naxin Cui; Chunyu Wang ; Miao Liu; Ruizhi Gao; 2017 Chinese Automation Congress (CAC); Year: 2017; pp. 5630-5634.*
State Intellectual Property Office of the People's Republic of China, Office Action for Chinese Patent Application No. 201610632768.X dated Aug. 15, 2018.

* cited by examiner

SYSTEM AND METHOD FOR MONITORING A STATE OF CHARGE OF A BATTERY

TECHNICAL FIELD

The technical field generally relates to battery monitoring systems, and more particularly relates to systems and methods for monitoring a state of charge of a battery of a vehicle.

BACKGROUND

Modern vehicles, such as automobiles, are often equipped with various electronic vehicle systems that receive power from a battery. Some exemplary electronic vehicle systems include media and entertainment systems, vehicle control systems, HVAC systems, and vehicle operational systems. As the battery is responsible for powering all these systems, it is important for vehicles to monitor the health and state of charge of the battery to ensure optimal operation of the electronic vehicle systems. However, certain high load systems such as electric power steering (EPS) systems may require significant amounts of power from the battery and cause voltage drops in the vehicle's electrical system.

Accordingly, it is desirable to provide systems and methods for monitoring a state of charge of a battery of a vehicle when the battery is under load from an EPS event. In addition, it is desirable to instruct the EPS to operate in a limited state when the state of charge of the battery is low. Other desirable features and characteristics of the present invention will become apparent from the subsequent detailed description and the appended claims, taken in conjunction with the accompanying drawings and the foregoing technical field and background.

SUMMARY

In one embodiment, a method for monitoring a state of charge of a battery of a vehicle is provided. The method monitors an operating voltage of the battery with a battery monitor and calculates a voltage drop between the operating voltage and a loaded voltage with the battery monitor when the battery is under load from an electric power steering system maneuver. The method compares the voltage drop to a predetermined voltage drop and determines that the state of charge of the battery is low when the voltage drop is greater than or equal to the predetermined voltage drop. When the state of charge of the battery is low, the method operates the electric power steering system in a limited state.

In one embodiment a monitoring system for determining a state of charge of a battery of a vehicle is provided. The monitoring system includes a battery monitor having a processor and a memory, the battery monitor configured to monitor an operating voltage and a loaded voltage of the battery. The monitoring system further includes an electric power steering system configured to be supplied with power from the battery. The battery monitor is configured to calculate a voltage drop between the operating voltage and the loaded voltage when the battery is under load from the electric power steering system and compare the voltage drop to a predetermined voltage drop. The battery monitor determines that the state of charge of the battery is low when the voltage drop is greater than or equal to the predetermined voltage drop and instructs the electric power steering system to operate in a limited state when the state of charge of the battery is low.

In one embodiment a vehicle having a battery, an electric power steering system, and a monitoring system for determining a state of charge of the battery is provided. The electric power steering system is configured to be supplied with power from the battery. The monitoring system includes a battery monitor having a processor and a memory, the battery monitor configured to monitor an operating voltage and a loaded voltage of the battery. The monitoring system further includes an electric power steering system configured to be supplied with power from the battery. The battery monitor is configured to calculate a voltage drop between the operating voltage and the loaded voltage when the battery is under load from the electric power steering system and compare the voltage drop to a predetermined voltage drop. The battery monitor determines that the state of charge of the battery is low when the voltage drop is greater than or equal to the predetermined voltage drop and instructs the electric power steering system to operate in a limited state when the state of charge of the battery is low.

DESCRIPTION OF THE DRAWINGS

The exemplary embodiments will hereinafter be described in conjunction with the following drawing figures, wherein like numerals denote like elements, and wherein.

DETAILED DESCRIPTION

Figure 1:
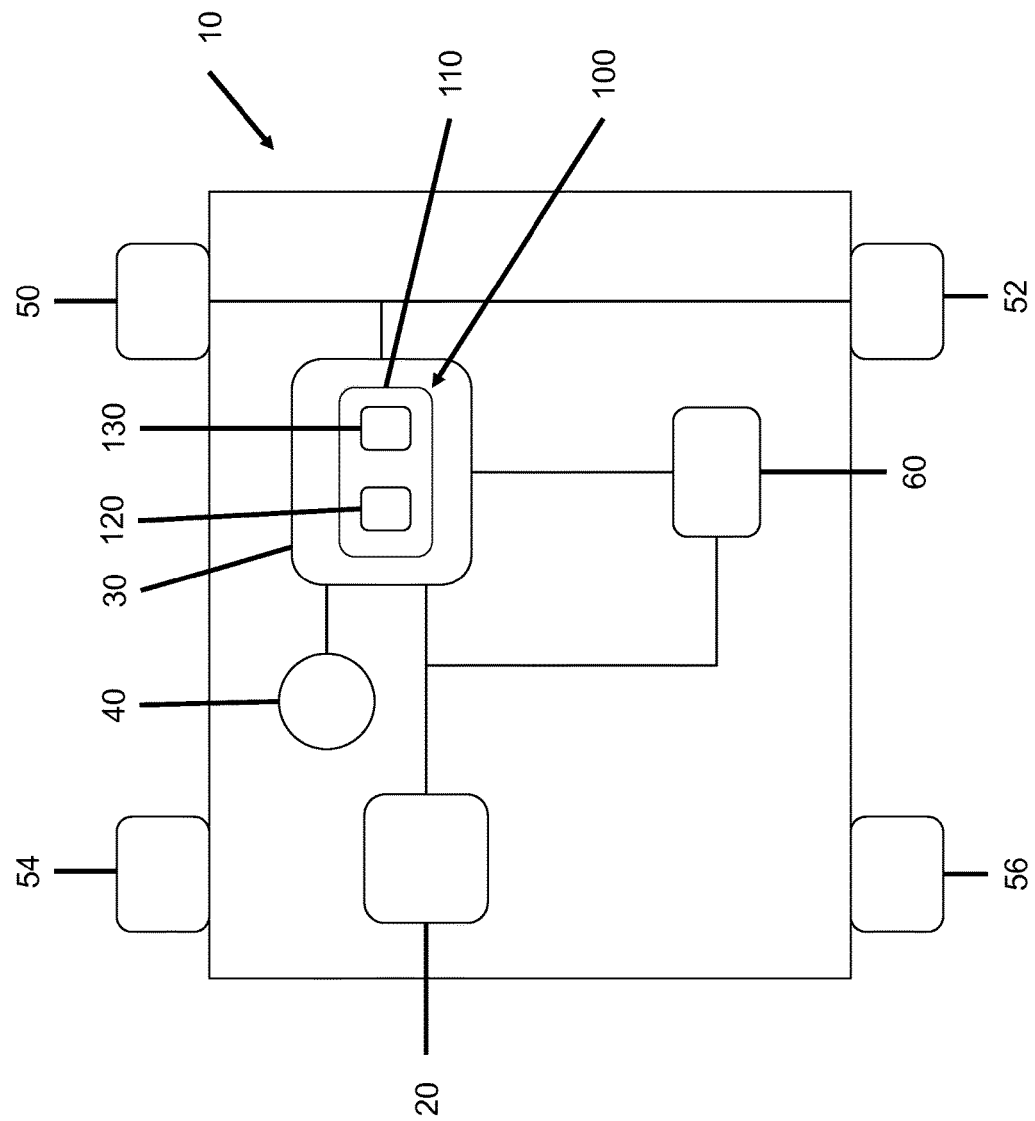
FIG. 1 illustrates a system for monitoring a state of charge of a battery in accordance with an exemplary embodiment.

The following detailed description is merely exemplary in nature and is not intended to limit the application and uses. Furthermore, there is no intention to be bound by any expressed or implied theory presented in the preceding technical field, background, brief summary or the following detailed description. It should be understood that throughout the drawings, corresponding reference numerals indicate like or corresponding parts and features. As used herein, the term module refers to any hardware, software, firmware, electronic control component, processing logic, and/or processor device, individually or in any combination, including without limitation: application specific integrated circuit (ASIC), an electronic circuit, a processor (shared, dedicated, or group) and memory that executes one or more software or firmware programs, a combinational logic circuit, and/or other suitable components that provide the described functionality.

Referring to the Figures, wherein like numerals indicate like parts throughout the several views, a vehicle 10 having a monitoring system 100 for determining a state of charge of a battery 20 is shown herein. In the exemplary embodiments, the vehicle 10 is an automobile. However, the monitoring system 100 for determining a state of charge of a battery 20 may be implemented and/or utilized in other types of vehicles or in non-vehicle applications. For instance, other vehicles include, but are not limited to, aircraft, spacecraft, buses, trains, etc. As shown in FIG. 1, the vehicle 10 includes the monitoring system 100, the battery 20, an electric power steering system (EPS) 30, a steering wheel 40, and wheels 50-56. The functioning of the monitoring system 100 will be made clearer when the following is read with reference to the Figures.

With reference to FIG. 1, an embodiment of the vehicle 10 having the monitoring system 100 is provided in a block diagram. The vehicle 10 includes the battery 20 and the EPS 30. The EPS 30 is configured to be supplied with power from the battery 20 as is known to those skilled in the art. In the embodiment of FIG. 1, the EPS 30 includes the monitoring system 100 for determining the state of charge of the battery 20. The monitoring system 100 includes a battery monitor 110 having a processor 120 and a memory 130. The vehicle 10 also includes a steering input 40, for example a steering wheel, and wheels 50-56. The vehicle 10 further includes a vehicle control system 60.

In a non-limiting example, an operator (not shown) of the vehicle 10 uses the steering input 40 to steer the vehicle 10. The EPS 30 is instructed by the steering input 40 to turn the front wheels 50, 52 of the vehicle 10. The EPS 30 is configured to be supplied with power from the battery 20. Although not contemplated herein, the EPS 30 may turn the front wheels 50, 52 using steering systems such as rack and pinion, recirculating ball, ball and screw, steer by wire, etc. as known to those skilled in the art.

The monitoring system 100 for determining the state of charge of the battery 20 includes the battery monitor 110 having the processor 120 and the memory 130. The battery monitor 110 is configured to monitor an operating voltage and a loaded voltage of the battery 20. The operating voltage is the voltage of the battery 20 as the vehicle 10 operates. One skilled in the art will appreciate that various control systems 60 may be powered by the battery 20 and, as such, the operating voltage will be impacted by electrical systems (not shown) other than the EPS 30. In a non-limiting example, the operating voltage is the normative operating voltage of the vehicle 10 which may vary according to the individual operating characteristics of the vehicle 10.

In a non-limiting embodiment, the loaded voltage of the battery is the voltage of the battery 20 when the battery is under load from the EPS 30. When the EPS 30 is instructed by the steering input 40 to turn the vehicle 10, the EPS 30 draws power from the battery 20 to turn the front wheels 50, 52. However, one skilled in the art will appreciate that the amount of power required by the EPS 30 to turn the vehicle 10 depends on factors relating to the steering demand. For example, the EPS 30 requires more power to turn the front wheels 50, 52 during static steering event, when the vehicle 10 is not moving, than a dynamic steering event when the vehicle 10 is moving. Furthermore, the amount of power drawn by the EPS 30 from the battery 20 may depend on the amount of steering boost or assist provided by the EPS 30 as is known to those skilled in the art.

The battery monitor 110 is configured to calculate a voltage drop between the operating voltage and the loaded voltage when the battery 20 is under load from the EPS 30. The battery monitor 110 compares the voltage drop to a predetermined voltage drop and determines that the state of charge of the battery 20 is low when the voltage drop is greater than or equal to the predetermined voltage drop. When the state of charge of the battery 20 is low, the battery monitor 110 instructs the EPS 30 to operate in a limited state.

In a non-limiting embodiment, the battery monitor 110 is further configured to monitor a current load of the battery 20 and calculate the voltage drop when the current load on the battery 20 is greater than a predetermined current. For example, the predetermined current may be 60 Amps or 90 Amps. However, one skilled in the art will appreciate that the predetermined current may be selected based upon characteristics of the specific EPS 30 used in the vehicle 10, as well as the characteristics of other vehicle systems.

In a non-limiting embodiment, the battery monitor 110 is further configured to alert the vehicle control system 60 that the state of charge of the battery 20 is low when the voltage drop is greater than or equal to the predetermined voltage drop. Example vehicle control systems 60 include a vehicle safety system, a vehicle diagnostic system, an engine control system, etc. One skilled in the art will appreciate that when the state of charge of the battery 20 is low, all vehicle control systems 60 powered by the battery 20 may be impacted.

In a non-limiting embodiment, the battery monitor 110 is further configured to determine that the state of charge of the battery 20 is normal when the voltage drop is less than the predetermined voltage drop. This information may be provided to other vehicle control systems 60 to validate the state of charge of the battery 20.

In a non-limiting embodiment, the EPS 30 is configured to operate in a reduced current mode when the state of charge of the battery 20 is low. As discussed above, the current drawn by the EPS 30 from the battery 20 may vary depending on the steering situation. As such, when the state of charge of the battery 20 is low, the EPS 30 may operate in the reduced current mode to ensure that the current demand of the EPS 30 does not exceed the capacity of the battery 20.

In a non-limiting embodiment, the battery monitor 110 is configured to calculate the state of charge of the battery 20. The EPS 30 is configured to operate in the limited state based on the calculated state of charge of the battery 20 calculated by the battery monitor 110. In this way, when the state of charge of the battery 20 is low, the EPS 30 may operate in the limited state based on the calculated state of charge to ensure that the current demand of the EPS 30 does not exceed the capacity of the battery 20.

In a non-limiting embodiment, the battery monitor 110 is configured to store a history of voltage drops in the memory module 130 and predict the state of charge of the battery 20 based on the history of voltage drops. For example, the history of voltage drops stored in the memory module 130 may show that the voltage drops are increasing and that the battery 20 may soon have a low state of charge.

Figure 2:
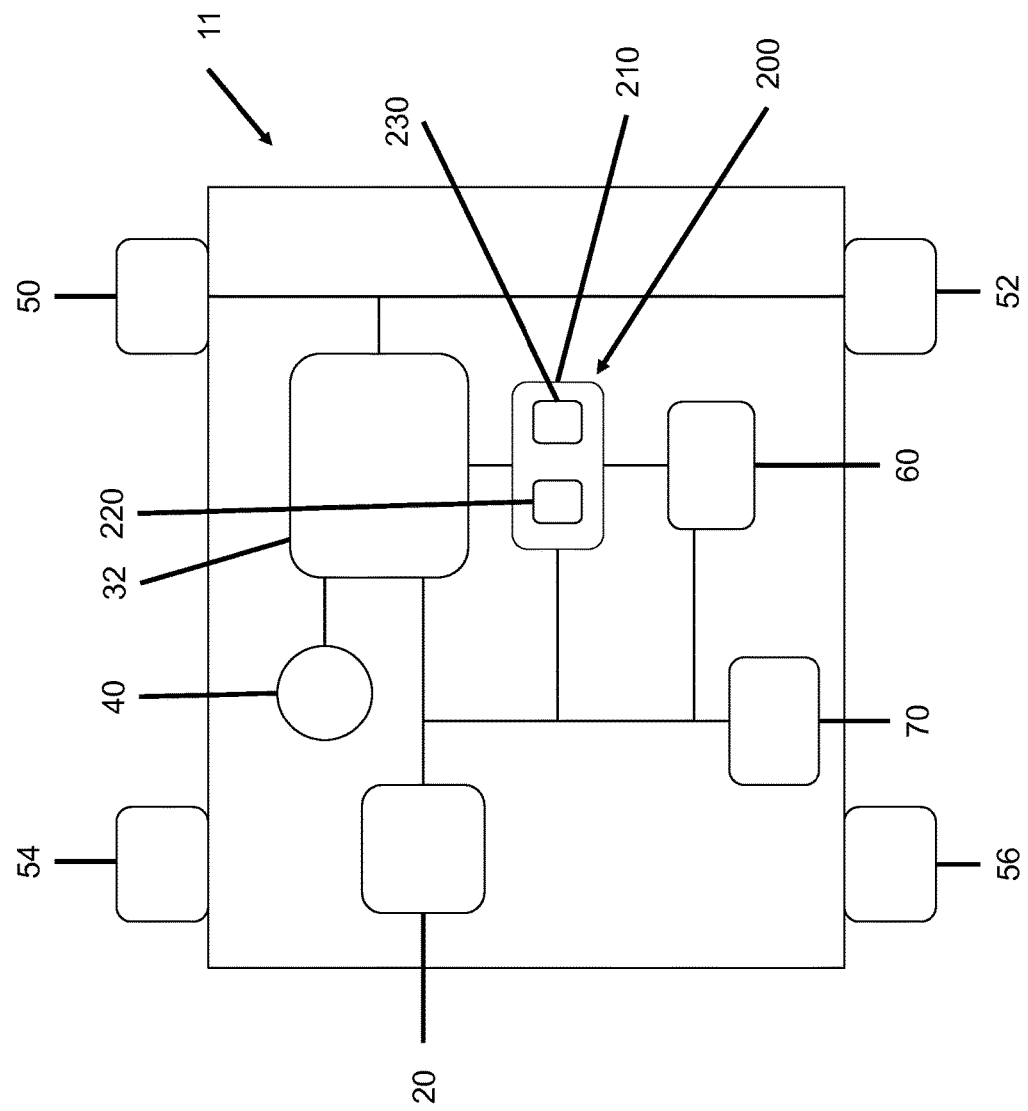
FIG. 2 illustrates a system for monitoring a state of charge of a battery in accordance with an exemplary embodiment.

With reference now to FIG. 2, an embodiment of a vehicle 11 having a monitoring system 200 for determining the state of charge of the battery 20 is provided in a block diagram. As with the embodiment of FIG. 1, the vehicle 11 includes the battery 20, the steering input 40, wheels 50-56, and the vehicle control system 60. In the embodiment of FIG. 2, the monitoring system 200 for determining the state of charge of the battery 20 is independent of, but operably coupled to, the EPS 32. The monitoring system 200 is in communication with the EPS 32, the battery 20, and the vehicle control system 60. The monitoring system 200 includes a battery monitor 210 having a processor 220 and a memory 230. The vehicle 11 may also include a high current system 70.

As the embodiment of FIG. 2 has common elements with the embodiment of FIG. 1, these common elements will not be again described. Instead, the differences in the embodiments will be described with respect to FIG. 2. As shown in FIG. 2, the monitoring system 200 is not incorporated into the EPS 32 and is instead in communication with the EPS 32, the battery 20, and the vehicle control system 60.

As detailed above, the battery monitor 210 is configured to calculate a voltage drop between the operating voltage and the loaded voltage when the battery 20 is under load from the EPS 32. The battery monitor 210 compares the voltage drop to a predetermined voltage drop and determines that the state of charge of the battery 20 is low when the voltage drop is greater than or equal to the predetermined voltage drop. When the state of charge of the battery 20 is low, the battery monitor 210 instructs the EPS 32 to operate in a limited state.

The vehicle 11 also includes the high current system 70 which is also in communication with the battery 20. In the embodiment of FIG. 2, the monitoring system 200 monitors the current load on the battery 20. An example high current system 70 includes a starter motor, audio system, or other vehicle system capable of drawing a high amount of current from the battery 20. Accordingly, the battery monitor 210 is configured to further calculate a voltage drop between the operating voltage and the loaded voltage when the battery 20 is under load from the high current system 70. The monitoring system 200 may further monitor additional inputs commonly used in vehicle control systems such as vehicle speed, engine temperature, air temperature, braking status, etc. to optimize the monitoring system 200.

Figure 3:
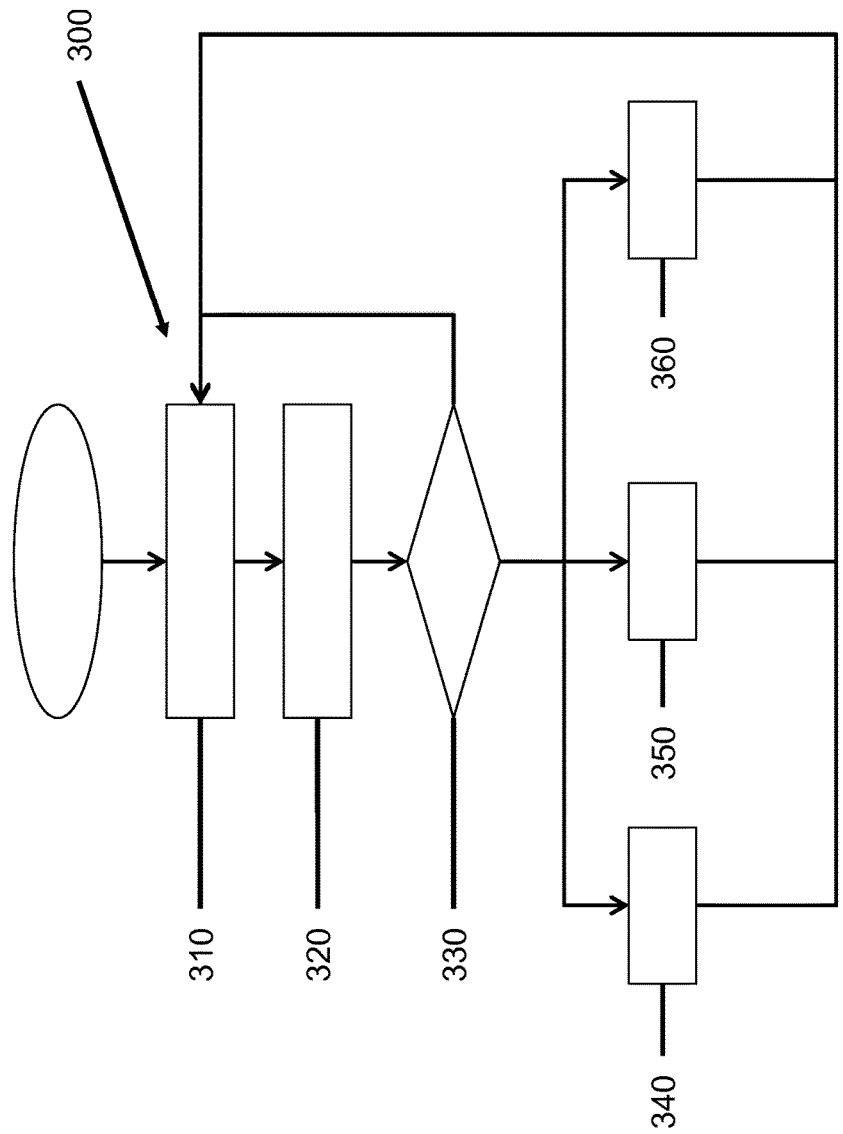
FIG. 3 illustrates a method for monitoring a state of charge of a battery in accordance with an exemplary embodiment.

With reference now to FIG. 3 and with continued reference to FIGS. 1-2, a method 300 for monitoring the state of charge of the battery 20 of the vehicle 10, 11 is provided. The method 300 starts and at step 310, a battery monitor 110, 210 monitors an operating voltage of the battery 20. At step 320, a voltage drop between the operating voltage and a loaded voltage is calculated by the battery monitor 110, 210 when the battery 20 is under load from the EPS 30, 32.

At step 330, the voltage drop is compared to a predetermined voltage drop. If the voltage drop is less than the predetermined voltage drop, the method 300 returns to step 310 and continues to monitor the operating voltage of the battery 20. If the voltage drop is greater than or equal to the predetermined voltage drop, the state of charge of the battery is low and the method 300 proceeds to step 340 and the EPS 30, 32 is operated in a limited state. Following step 340 the method 300 returns to step 310 and continues to monitor the operating voltage of the battery 20.

In a non-limiting embodiment, the method 300 further includes step 350. In step 350, the method 300 alerts a vehicle control system 60 that the state of charge of the battery 20 is low when the voltage drop calculated in step 320 is greater than or equal to the predetermined voltage drop.

In a non-limiting embodiment, the method 300 performs step 320 and calculates the voltage drop when a current load on the battery 20 is greater than a predetermined current for different current loads. In a non-limiting embodiment, the voltage drop is calculated over an entire operating range and then compared against a "normal" voltage drop.

In a non-limiting embodiment, in step 340 the EPS 30, 32 operates in a reduced current mode when the state of charge of the battery 20 is low. In a non-limiting embodiment, the reduced current mode can include limiting peak current under low speed conditions or limiting peak current under all vehicle speed conditions. The EPS 30, 32 may also operate in a limited energy pull mode to limit the impact on the battery 20 when the battery has a very low state of charge to prevent severe voltage drops. The reduced current mode can be temporary in time or only be in effect when the state of charge of the battery 20 is low.

In a non-limiting embodiment, the reduced current mode includes limiting the steering boost or assist provided by the EPS 30, 32 or delivering alternative feedback such as small vibrations through the steering input 40 to advise the operator that the battery 20 is in a low charge state or by notifying the driver by a reduced performance message on the dash, driver information center, and/or a periodic chime.

In a non-limiting embodiment, the method 300 calculates the state of charge of the battery 20 and operates the EPS 30, 32 in the limited state based on the calculated state of charge of the battery. The method 300 calculates the state of charge of the battery 20 by comparing an observed voltage drop for certain high current events against a historical average of normal voltage drops for a normal battery 20. The calculated state of charge can further be used to scale the amount of current limiting the system provides when operating in the reduced current mode.

In a non-limiting embodiment, the method 300 further includes step 360. In step 360, the method 300 stores a history of voltage drops in the memory 130, 230, and predicts the state of charge of the battery 20 based on the history of voltage drops. The history of voltage drops can be preprogrammed or learned based on past usage in the vehicle 10, 11 and overall electrical system. This history may also take into account additional factors such as the temperature and age of the product to offer a better performance of the overall vehicle system. The level of voltage drop may also include the effect of other vehicle level electrical loads to better represent the true voltage drop caused by the measured current and voltage drop due to the EPS 30, 32.

In a non-limiting embodiment, the EPS 30, 32 operates in limited state dynamically only when the state of charge of the battery 20 is low. In a non-limiting embodiment, the EPS 30, 32 operates in limited state over a predetermined period of time. For example once the low state of charge condition is detected, the EPS 30, 32 could maintain the limited state for a predetermined number of seconds, minutes, hours, etc. In a non-limiting embodiment, the EPS 30, 32 could exit the limited state operation in several manners. For example, after the predetermined period of time has expired or by gradually increasing the current limit of the limited state.

In a non-limiting embodiment, the monitoring system 100, 200 can set a code in a vehicle communication system advising the driver that a low state of charge exists. Exemplary vehicle communication systems include, but are not limited to, a driver information center, a infotainment system, a vehicle communication bus, or other vehicle communication systems. The monitoring system 100, 200 can further communicate with vehicle communication systems capable of communicating to remote services, for example Onstar®. The monitoring system 100, 200 can also send an alternative communication, such as a call, email, text message, etc., to an owner of the vehicle 10, 11 advising that the battery 20 is in a low charge state.

While various exemplary embodiments have been presented in the foregoing detailed description, it should be appreciated that a vast number of variations exist. It should also be appreciated that the exemplary embodiments are only examples, and are not intended to limit the scope, applicability, or configuration of the disclosure in any way. Rather, the foregoing detailed description will provide those skilled in the art with a convenient road map for implementing the exemplary embodiments. It should be understood that various changes can be made in the function and arrangement of elements without departing from the scope of the disclosure as set forth in the appended claims and the legal equivalents thereof.

What is claimed is:

1. A method for monitoring a state of charge of a battery of a vehicle comprising:
   monitoring an operating voltage of the battery with a battery monitor;

calculating a voltage drop between the operating voltage and a loaded voltage with the battery monitor when the battery is under load from an electric power steering system;

comparing the voltage drop to a predetermined voltage drop;

determining that the state of charge of the battery is low when the voltage drop is greater than or equal to the predetermined voltage drop; and operating the electric power steering system in a limited state, wherein when the state of charge of the battery is low the current draw of the electric power steering system is limited to a current draw less than a peak current draw requirement when the voltage drop is less than the predetermined voltage drop.

2. The method of claim 1, further comprising:

alerting a vehicle control system that the state of charge of the battery is low when the voltage drop is greater than or equal to the predetermined voltage drop; and providing a haptic response through a steering wheel of the vehicle.

3. The method of claim 1, further comprising:

calculating the voltage drop when a current load on the battery from the electric power steering system is greater than a predetermined current.

4. The method of claim 1, wherein the electric power steering system operates in a reduced current mode when the state of charge of the battery is low.

5. The method of claim 1, further comprising:

calculating the state of charge of the battery; and operating the electric power steering system in the limited state based on the calculated state of charge of the battery.

6. The method of claim 1, further comprising:

storing a history of voltage drops in a memory; and predicting the state of charge of the battery based on the history of voltage drops.

7. A monitoring system for determining a state of charge of a battery of a vehicle, comprising:

a battery monitor having a processor and a memory, the battery monitor configured to monitor an operating voltage and a loaded voltage of the battery; and an electric power steering system configured to be supplied with power from the battery, wherein the battery monitor is configured to calculate a voltage drop between the operating voltage and the loaded voltage when the battery is under load from the electric power steering system, compare the voltage drop to a predetermined voltage drop, determine that the state of charge of the battery is low when the voltage drop is greater than or equal to the predetermined voltage drop, and instruct the electric power steering system to operate in a limited state when the state of charge of the battery is low; and wherein the electric power steering system is configured to operate when instructed by the battery monitor to limit a current draw of the electric power steering system to less than a peak current draw requirement when the voltage drop is less than the predetermined voltage drop.

8. The monitoring system of claim 7, wherein the battery monitor is further configured to monitor a current load of the battery and calculate the voltage drop when the current load of the battery is greater than a predetermined current.

9. The monitoring system of claim 7, wherein the battery monitor is configured to alert a vehicle control system that the state of charge of the battery is low when the voltage drop is greater than or equal to the predetermined voltage drop; and to provide a haptic response through a steering wheel of the vehicle.

10. The monitoring system of claim 7, wherein the battery monitor is configured to determine that the state of charge of the battery is normal when the voltage drop is less than the predetermined voltage drop.

11. The monitoring system of claim 7, wherein the electric power steering system is configured to operate in a reduced current mode when the state of charge of the battery is low.

12. The monitoring system of claim 7, wherein the battery monitor is configured to calculate the state of charge of the battery and the electric power steering system is configured to operate in the limited state based on the calculated state of charge of the battery.

13. The monitoring system of claim 7, wherein the battery monitor is configured to store a history of voltage drops in the memory module and predict the state of charge of the battery based on the history of voltage drops.

14. A vehicle, comprising:

a battery;

an electric power steering system configured to be supplied with power from the battery; and a monitoring system for determining a state of charge of the battery, the monitoring system comprising:

a battery monitor having a processor and a memory, the battery monitor configured to monitor an operating voltage and a loaded voltage of the battery, wherein the battery monitor is configured to calculate a voltage drop between the operating voltage and the loaded voltage when the battery is under load from the electric power steering system, compare the voltage drop to a predetermined voltage drop, determine that the state of charge of the battery is low when the voltage drop is greater than or equal to the predetermined voltage drop, and instruct the electric power steering system to operate in a limited state when the state of charge of the battery is low; and wherein the electric power steering system is configured to operate when instructed by the battery monitor to limit a current draw of the electric power steering system to less than a peak current draw requirement when the voltage drop is less than the predetermined voltage drop.

15. The vehicle of claim 14, wherein the battery monitor is configured to monitor a current load of the battery and calculates the voltage drop when the current load of the battery is greater than a predetermined current.

16. The vehicle of claim 14, wherein the battery monitor is configured to alert a vehicle control system that the state of charge of the battery is low when the voltage drop is greater than or equal to the predetermined voltage drop; and to provide a haptic response through a steering wheel of the vehicle.

17. The vehicle of claim 14, wherein the battery monitor is configured to determine that the state of charge of the battery is normal when the voltage drop is less than the predetermined voltage drop.

18. The vehicle of claim 14, wherein the electric power steering system is configured to operate in a reduced current mode when the state of charge of the battery is low.

19. The vehicle of claim 14, wherein the battery monitor is configured to calculate the state of charge of the battery and the electric power steering system is configured to operate in the limited state based on the calculated state of charge of the battery.

20. The vehicle of claim 14, wherein the battery monitor is configured to store a history of voltage drops in the memory module and predict the state of charge of the battery based on the history of voltage drops.

* * * * *